United States Patent
Nishino et al.

(10) Patent No.: US 11,069,548 B2
(45) Date of Patent: *Jul. 20, 2021

(54) SUBSTRATE PROCESSING METHOD AND SUBSTRATE PROCESSING SYSTEM

(71) Applicant: Tokyo Electron Limited, Tokyo (JP)

(72) Inventors: Toru Nishino, Miyagi (JP); Kiyohito Iijima, Miyagi (JP); Shigeru Ishizawa, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 71 days.

This patent is subject to a terminal disclaimer.

(21) Appl. No.: 16/535,374

(22) Filed: Aug. 8, 2019

(65) Prior Publication Data

US 2019/0362996 A1   Nov. 28, 2019

Related U.S. Application Data

(63) Continuation of application No. 15/687,649, filed on Aug. 28, 2017, now Pat. No. 10,403,525.

(30) Foreign Application Priority Data

Aug. 31, 2016   (JP) .................................. 2016-170312

(51) Int. Cl.
*H01L 21/67* (2006.01)
*G05B 19/418* (2006.01)
*H01L 21/677* (2006.01)

(52) U.S. Cl.
CPC .... *H01L 21/67294* (2013.01); *G05B 19/4189* (2013.01); *G05B 19/41865* (2013.01);
(Continued)

(58) Field of Classification Search
CPC ......... H01L 21/67069; H01L 21/67173; H01L 21/67248; H01L 21/67265;
(Continued)

(56) References Cited

U.S. PATENT DOCUMENTS 5,700,127 A    12/1997 Harada et al.
6,259,960 B1*   7/2001 Inokuchi ............ G01N 21/9501
                                              250/310
(Continued)

FOREIGN PATENT DOCUMENTS

JP    2008-108966    5/2008
JP    2011-151399    8/2011
(Continued)

*Primary Examiner* — Crystal J Barnes-Bullock
(74) *Attorney, Agent, or Firm* — IPUSA, PLLC (57) ABSTRACT

A substrate processing method is provided. The substrate processing method includes placing a substrate storage container storing a substrate on a load port; automatically determining a type of the substrate stored in the placed substrate storage container; by referring to a storage unit that stores a parameter data set related to a transport condition for each substrate type, controlling transport of the substrate stored in the substrate storage container based on the parameter data set corresponding to the automatically determined type of the substrate to process the substrate, and, after automatically determining the type of the substrate, and before transporting the substrate stored in the substrate storage container, performing mapping based on conditions set in the parameter data set to detect an abnormality of the substrate stored in the substrate storage container.

8 Claims, 6 Drawing Sheets

(52) U.S. Cl.
CPC .... *H01L 21/6773* (2013.01); *H01L 21/67173* (2013.01); *H01L 21/67248* (2013.01); *H01L 21/67265* (2013.01); *H01L 21/67276* (2013.01); *H01L 21/67727* (2013.01); *H01L 21/67742* (2013.01); *H01L 21/67745* (2013.01); *H01L 21/67769* (2013.01); *H01L 21/67772* (2013.01); *H01L 21/67775* (2013.01); *B65G 2201/0297* (2013.01); *G05B 2219/31276* (2013.01); *G05B 2219/32173* (2013.01); *G05B 2219/32174* (2013.01); *G05B 2219/45031* (2013.01); *H01L 21/67069* (2013.01); *Y02P 90/02* (2015.11); *Y10S 134/902* (2013.01); *Y10S 414/14* (2013.01)

(58) Field of Classification Search
CPC ......... H01L 21/67276; H01L 21/67294; H01L 21/67727; H01L 21/6773; H01L 21/67742; H01L 21/67745; H01L 21/67769; H01L 21/67772; H01L 21/67775; G05B 19/41865; G05B 19/4189; G05B 2219/32173; G05B 2219/32174; G05B 2219/31276; G05B 2219/45031; B65G 2201/0297; Y10S 134/902; Y10S 414/14; Y02P 90/02

See application file for complete search history.

(56) References Cited

U.S. PATENT DOCUMENTS

| | | |
|---|---|---|
| 6,375,403 B1 | 4/2002 | Mages et al. |
| 6,629,053 B1 | 9/2003 | Mooring |
| 9,960,065 B2 * | 5/2018 | Kawasaki ......... H01L 21/67393 |
| 2006/0045665 A1 | 3/2006 | Hall et al. |
| 2006/0162660 A1 | 7/2006 | Shimizu |
| 2006/0182533 A1 | 8/2006 | Ogi |
| 2007/0098526 A1 | 5/2007 | Naito |
| 2010/0057239 A1 | 3/2010 | Masuda et al. |
| 2012/0251957 A1 | 10/2012 | Yamamoto et al. |
| 2015/0000591 A1 | 1/2015 | Kawasaki et al. |

FOREIGN PATENT DOCUMENTS

| | | |
|---|---|---|
| JP | 2014-138121 | 7/2014 |
| WO | 2004/051713 | 6/2004 |

* cited by examiner

| RECIPE B | | | | |
| RECIPE A | STEP1 | STEP2 | ... | STEP5 |
|---|---|---|---|---|
| | STEP1 | STEP2 | ... | STEP5 |
| TEMPER-ATURE [°C] | T1 | T2 | ... | T5 |
| PRESSURE [Pa] | P1 | P2 | ... | P5 |
| RF [W] | W1 | W2 | ... | W5 |
| ⋮ | ⋮ | ⋮ | ⋮ | ⋮ |

| PARAMETER DATA FOR TEMPERATURE MEASUREMENT | |
|---|---|
| TEMPERATURE [°C] | Max Td |
| PRESSURE [Pa] | Max Pd |
| | Min Pe |
| RF [W] | Max Wd |
| TRANSPORT SPEED [m/s] | Max Vd |

16b

| PARAMETER DATA FOR DUMMY WAFER | |
|---|---|
| TEMPERATURE [°C] | Max Tf |
| PRESSURE [Pa] | Max Pf |
| | Min Pg |
| RF [W] | Max Wf |
| TRANSPORT SPEED [m/s] | Max Vf |

A1–A4 PROTRUSIONS ⇩ DETERMINED TO BE A PRODUCT WAFER

FIG.6B

A1, A3 PROTRUSIONS ⇩ DETERMINED TO BE A WAFER FOR TEMPERATURE MEASUREMENT

FIG.7

SUBSTRATE PROCESSING METHOD AND SUBSTRATE PROCESSING SYSTEM

CROSS-REFERENCE TO RELATED APPLICATION

The present application is a continuation application of U.S. patent application Ser. No. 15/687,649, filed Aug. 28, 2017 which claims priority to Japanese patent application No. 2016-170312 filed with the Japanese Patent Office on Aug. 31, 2016, the entire contents of which are hereby incorporated by reference.

BACKGROUND OF THE INVENTION

1. Field of the Invention

The present invention relates to a substrate processing method and a substrate processing system.

2. Description of the Related Art

A product wafer has dimensions including a thickness and a weight defined by SEMI standards (guidelines of semiconductor manufacturing apparatus defined by Semiconductor Equipment and Materials International). With respect to the above, a thickness and a weight of a temperature measurement wafer are different from a thickness and a weight of a product wafer. Because of the above-described differences, a determination value for abnormality detection at the time of mapping, an upper limit value for transport speed, an upper limit value for process temperature, an upper limit value for high-frequency power (RF Power), etc., of a temperature measurement wafer are different from those of a product wafer.

With respect to the above, Patent Document 1 describes a device that measures and records conditions in a target environment during a specific step of a temperature measurement wafer, and automatically returns to a substrate processing system.

CITATION LIST

Patent Document

[Patent Document 1] Japanese Unexamined Patent Application Publication No. 2011-151399

SUMMARY OF THE INVENTION

Technical Problem

However, in Patent Document 1, for example, when a substrate storage container in which a temperature measurement wafer is included (hereinafter, referred to as "FOUP (Front Opening Unified Pod)") is placed on a load port, it is not possible to automatically determine that a temperature measurement wafer is stored, and to change a transport condition or a mapping setting condition. Therefore, it is difficult in Patent Document 1 to appropriately perform processing and transport of a substrate for each substrate type according to the type of a wafer stored in the FOUP.

In view of the above problem, it is an object of an aspect of the present invention to appropriately perform processing and transport of a substrate for each substrate type according to the substrate type.

Solution to Problem

In order to solve the above-described problem, according to an embodiment, a substrate processing method is provided. The substrate processing method includes placing a substrate storage container storing a substrate on a load port; automatically determining a type of the substrate stored in the placed substrate storage container; by referring to a storage unit that stores a parameter data set related to a transport condition for each substrate type, controlling transport of the substrate stored in the substrate storage container based on the parameter data set corresponding to the automatically determined type of the substrate to process the substrate, and, after automatically determining the type of the substrate, and before transporting the substrate stored in the substrate storage container, performing mapping based on conditions set in the parameter data set to detect an abnormality of the substrate stored in the substrate storage container.

Advantageous Effects of the Invention

According to an aspect of an embodiment, it is possible to appropriately perform processing and transport of a substrate of each substrate type.

DETAILED DESCRIPTION OF THE PREFERRED EMBODIMENTS

In the following, embodiments of the present invention will be described while making reference to the drawings. It should be noted that, in the specification and the drawings, elements that are substantially the same are given the same reference numerals in order to avoid duplicated descriptions.

<Overall Structure of Plasma Processing System>

Figure 1:
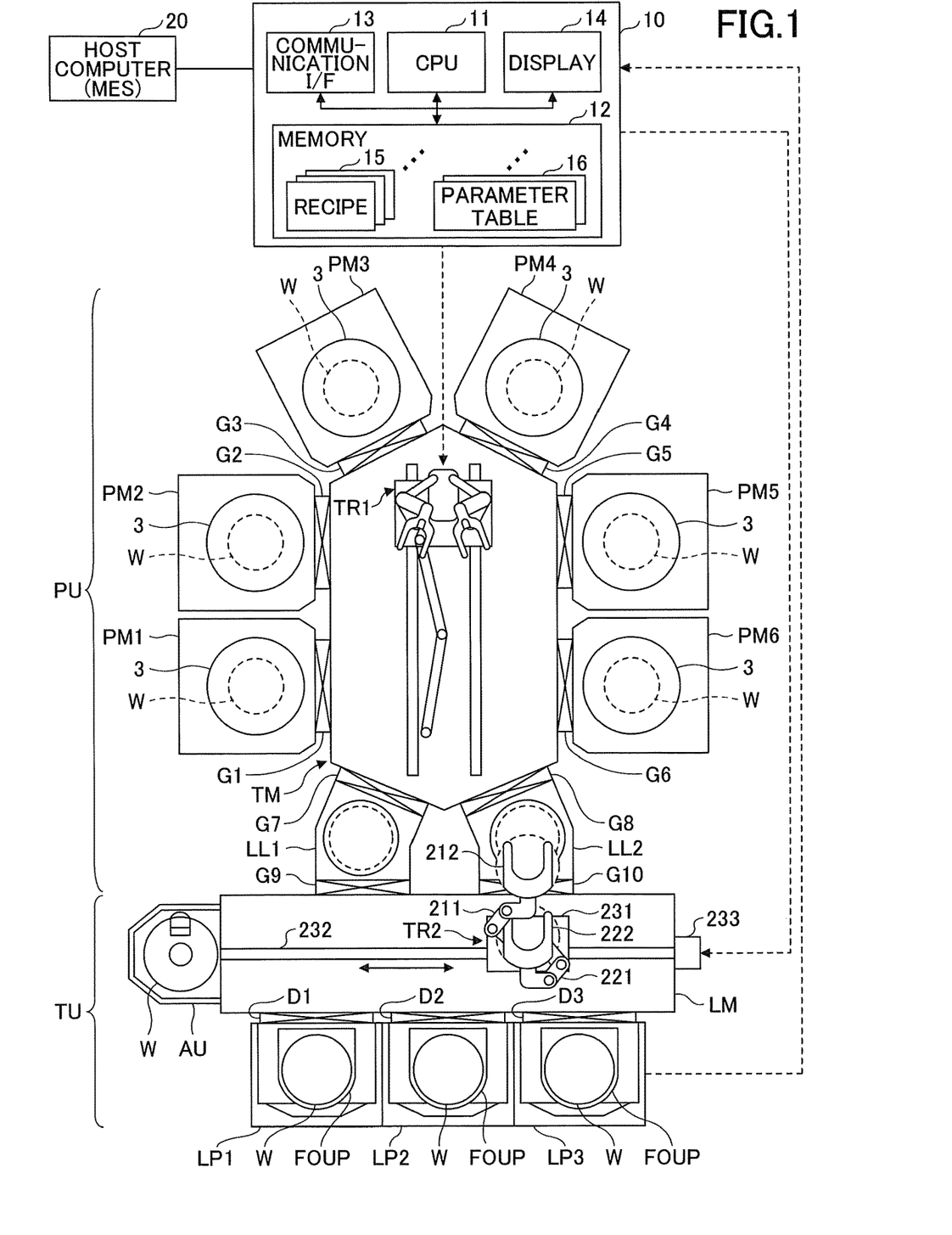
FIG. 1 is a drawing illustrating an example of a plasma processing system according to an embodiment of the invention.

First, referring to FIG. 1, an example of an overall structure of a plasma processing system according to an embodiment of the present invention will be described. FIG. 1 illustrates an example of a plasma processing system according to an embodiment. The plasma processing system is an example of a substrate processing system, and is a cluster tool that includes a processing unit PU and a transport unit TU.

The processing unit PU performs predetermined processes including a film deposition process, an etching process, etc., for a substrate such as a semiconductor wafer (hereinafter, referred to as "wafer W"). The processing unit PU includes process modules PM1-PM6 (hereinafter, collectively referred to as "process module PM"), a transfer module TM, and load lock modules LL1, LL2. It should be noted that the number of process modules PM and the number of the load lock modules LL are not limited to the above.

The process modules PM1-PM6 are connected to the periphery of the transfer module TM, and perform predetermined processes including a film deposition process, an etching process, etc., for the wafer W. It should be noted that the process modules PM1-PM6 may perform the same type of processes or different types of processes.

Inside each of the process modules PM1-PM6, a stage 3 for placing a wafer W is disposed. Further, in the process modules PM1-PM6, for example, a gas introduction system that introduces a purge gas, a gas introduction system that introduces a process gas, and an exhaust system capable of vacuum-drawing are included.

In the process modules PM1-PM6, predetermined process and transport for the wafer W are performed based on a recipe 15 which is stored in advance in the storage unit indicated as a memory 12 of a control unit 10 and which indicates procedures of the process and the transport.

The transfer module TM is formed in a hexagonal shape in which a pair of sides facing each other are longer than the remaining sides. The process modules PM3, PM4 are connected to the two short sides of the top end of the transfer module TM via gate valves G3 and G4, respectively. The load lock modules LL1 and LL2 are connected to the two short sides of the bottom end of the transfer module TM via gate valves G7 and G8, respectively. The process modules PM1, PM2 are connected to one of the long sides of the transfer module TM via gate valves G1 and G2, respectively. The process modules PM5, PM6 are connected to the other of the long sides of the transfer module TM via gate valves G5 and G6, respectively.

The transfer module TM has a function for transporting (loading and unloading) the wafer W among the process modules PM1-PM6, and between the process modules PM1-PM6 and the load lock modules LL1, LL2. In the transfer module TM, a gas introduction system that introduces, for example, a purge gas and an exhaust system capable of vacuum-drawing, are included.

Inside the transfer module TM, a processing unit side transport apparatus TR1 is disposed. The processing unit side transport apparatus TR1 is used for transporting the wafer W among the modules including the process modules PM1-PM6 and load lock modules LL1, LL2. It should be noted that the detail of the processing unit side transport apparatus TR1 will be described later.

The load lock modules LL1, LL2 are connected to a load/unload module (transport module) LM via gate valves G9, G10, respectively. The load lock modules LL1, LL2 has a function for temporarily holding the wafer W that is transported from the load/unload module LM, and for, after adjusting the pressure, transporting the wafer W to the transfer module TM. Further, the load lock modules LL1, LL2 has a function for temporarily holding the wafer W that is transported from the transfer module TM, and for, after adjusting the pressure, transporting the wafer W to the load/unload module LM.

Inside the load lock modules LL1, LL2, delivery tables capable of placing the wafer W are disposed, respectively. Further, in the load lock modules LL1, LL2, an exhaust system capable of purging and exhausting particles such as a residue is included.

In the above-described processing unit PU, airtight opening/closing is enabled between the process modules PM1-PM6 and the transfer module TM, and between the transfer module TM and the load lock modules LL1, LL2. Further, the airtight opening/closing is enabled between the load/unload module LM and the load lock modules LL1, LL2.

The transport unit TU is used for transporting a wafer W between a FOUP and the processing unit PU, and includes the load/unload module LM.

The load/unload module LM is formed in a rectangular shape. Along one of long sides of the load/unload module LM, multiple load ports LP1-LP3 are disposed side by side. It is possible to place a FOUP on each of the load ports LP1-LP3. It should be noted that FIG. 1 illustrates a case in which FOUPs are placed on all of the load ports LP1-LP3. The FOUP is a container capable of accommodating, for example, twenty five (25) sheets of wafer W placed in multistage slots disposed at an equal pitch. Types of the wafer W to be stored in the FOUP include a product wafer and a measurement wafer for measuring temperature, pressure, etc.

The dimensions, thickness and weight of a product wafer are defined by SEMI standards. With respect to the above, the thickness and weight of a measurement wafer are not defined by SEMI standards, and thus, there is a case in which a measurement wafer is thicker or heavier than a product wafer. A list of measurement wafers includes, for example, a temperature measurement wafer on which a temperature sensor is mounted, a pressure measurement wafer on which a pressure sensor is mounted, a ion density detection wafer on which an ion density detection sensor is mounted, etc. It should be noted that a measurement wafer is an example of a special substrate. Further, a product wafer includes a dummy wafer that is used for a cleaning process, a seasoning process, etc. A product wafer including a dummy wafer is an example of a product substrate.

The load port LP may include a Carrier ID Reader which reads a carrier ID included in a FOUP.

A FOUP has a sealed structure the inside of which is filled with, for example, a N2 (nitrogen) gas. A FOUP is connected to the load/unload module LM via open/close doors D1-D3. It should be noted that the number of load ports LP is not limited to the above.

An aligner AU is disposed on one of the short sides of the load/unload module LM. The inside of the aligner AU includes a rotating stage on which a wafer W is to be placed and an optical sensor which optically detects the peripheral portion of the wafer W. The aligner AU performs alignment of the wafer W by detecting, for example, an orientation flat, a notch, etc., of the wafer W.

Inside the load/unload module LM, a transport unit side transport apparatus TR2 used for transporting the wafer W among the modules including the load lock modules LL1, LL2, the FOUPs, and the aligner is disposed. The transport unit side transport apparatus TR2 includes a transport arm that is rotatably attached to a base 231 via a rotation mechanism. The transport unit side transport apparatus TR2 is capable of sliding along the longitudinal direction of the load/unload module LM via a slide mechanism. The transport arm of the transport unit side transport apparatus TR2 has a double arm mechanism with, for example, a pair of articulated arms. The transport arm includes a first arm 211 and a second arm 221 which are articulated expandable/contractible arms, and one of which is installed on top of the other.

The slide mechanism of the transport unit side transport apparatus TR2 includes, for example, a linear motor. Specifically, inside the load/unload module LM, a guide rail 232 is disposed along the longitudinal direction of the load/ unload module LM. The base 231, to which the transport arm is attached, is disposed along the guide rail 232 and is capable of sliding. The base 231 and the guide rail 232 include a linear rotor and a linear stator of the linear motor, respectively. At the end of the guide rail 232, a linear motor drive mechanism 233 for driving the linear motor is disposed. The control unit 10 is connected to the linear motor drive mechanism 233. With this arrangement, the linear motor drive mechanism 233 is driven based on a control signal from the control unit 10, and the transport unit side transport apparatus TR2 moves together with the base 231 in an arrow direction along the guide rail 232. It should be noted that the slide mechanism of the transport unit side transport apparatus TR2 is not limited to the above-described mechanism, and may be a different mechanism.

The first arm 211 and the second arm 221, as the transport arm of the transport unit side transport apparatus, include picks 212, 222, respectively, at the tip, and thus, the first arm 211 and the second arm 221 are designed to be capable of simultaneously holding two sheets of wafer W or two focus rings. With this arrangement, when transporting the wafer W for the load lock modules LL1, LL2, the FOUPs, and the aligner AU, it is possible to transport the wafer W to exchange the wafer W. It should be noted that a sheet of wafer W and a focus ring may be simultaneously held and simultaneously transported. Further, the number of the transport arms of the transport unit side transport apparatus TR2 is not limited to the above. For example, the transport arm may have a single arm mechanism with a single arm.

Further, the transport unit side transport apparatus TR2 includes a rotation motor, an expansion and contraction motor, and an up and down motor (not shown in the figure) for moving the transport arm in a rotational manner, an expansion and contraction manner, and an up and down manner. Each of the motors is connected to the control unit 10, and is capable of controlling the transport arm of the transport unit side transport apparatus TR2 based on a control signal from the control unit 10.

Further, the transport unit side transport apparatus TR2 includes a mapping sensor that detects existence/non-existence of wafer in the FOUP placed on the load port LP, existence/non-existence of multiple sheets of wafer in a same slot, and existence/non-existence of wafer placed slantingly in the slot. The mapping sensor performs mapping in the FOUP according to the up and down motor of the transport unit side transport apparatus TR2.

The plasma processing system is controlled by the control unit 10. Specifically, the control unit 10 controls each of the units of the plasma processing system including, for example, a processing unit side transport apparatus TR2, the transport unit side transport apparatus TR2, the gate valves G1-G10, the open/close doors D1-D3, the aligner AU, etc.

(Control Unit)

The control unit 10 includes a CPU (Central Processing Unit) 11, a memory 12, a communication I/F (interface) 13, and a display 14. The CPU 11 controls processes and transport of the wafer W based on a recipe 15 and a parameter table 16 stored in the memory 12. The processes of the wafer W includes a process for automatically determining the type of wafer W, a plasma process such as an etching process of wafer W or a film deposition process, and a mapping (process) for detecting abnormality which will be described later.

Figure 2:
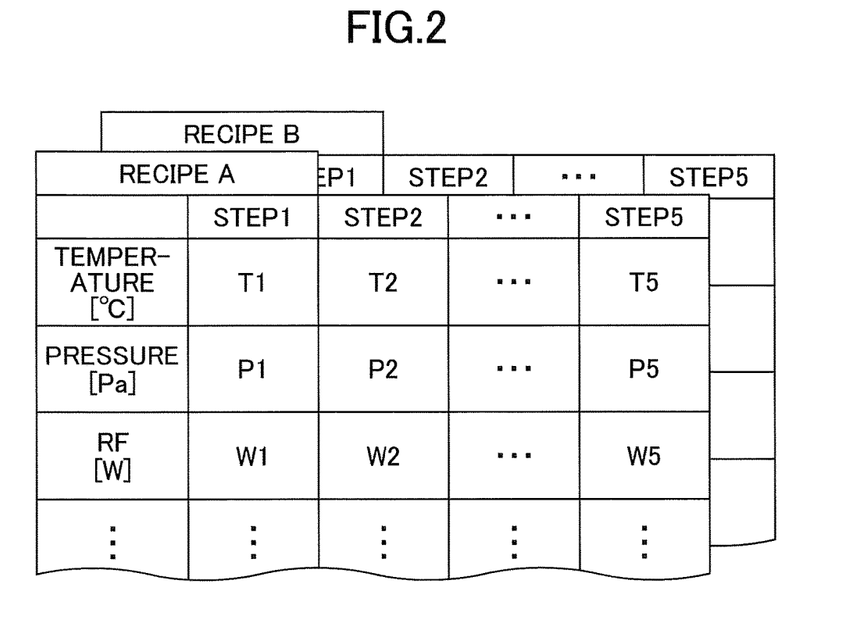
FIG. 2 is a drawing illustrating examples of recipes used for the plasma processing system.

FIG. 2 illustrates an example of a recipe used for a plasma process according to an embodiment. In the recipe, conditions (process conditions) in a processing procedure from step 1 to step n (step 1 to step 5 in FIG. 2) are set in advance.

For example, as the process conditions, a temperature of wafer transported to the process module PM, an internal pressure, a high-frequency power (RF POWER), etc., can be listed.

Figure 3:
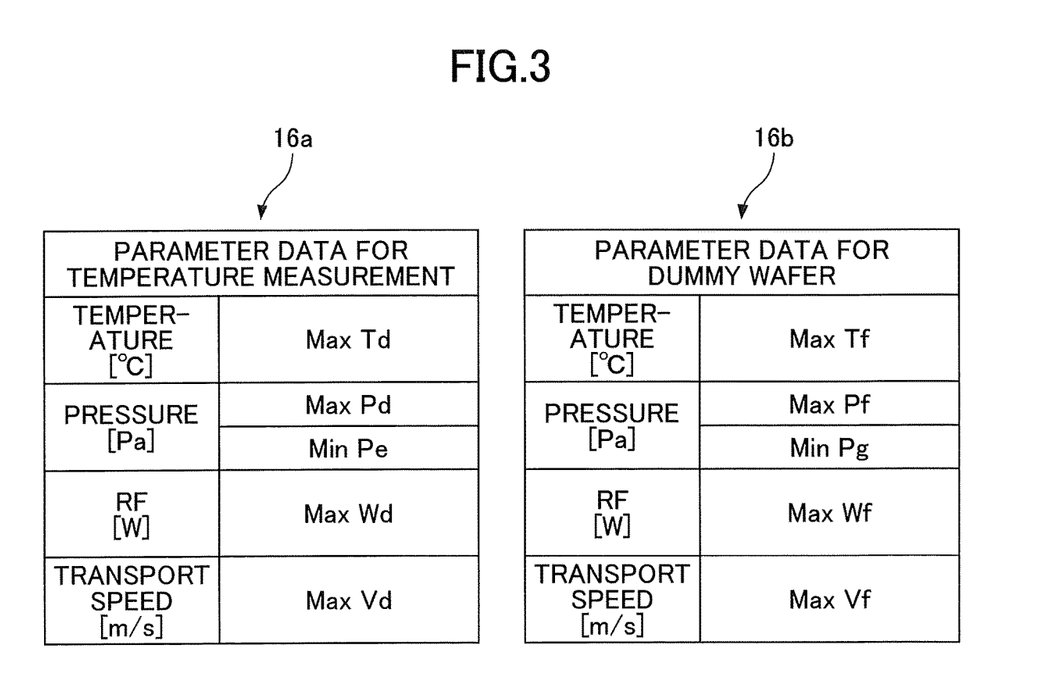
FIG. 3 is a drawing illustrating examples of parameter tables according to an embodiment of the invention.

FIG. 3 illustrates examples of the parameter table 16 according to an embodiment. FIG. 3 illustrates, as examples of the parameter table 16, a parameter table 16a in which a parameter data set for temperature measurement is defined, and a parameter table 16b in which a parameter data set for a dummy wafer is defined. It should be noted that the parameter data sets in the parameter tables 16a, 16b may be set in advance by an operator or may be set automatically.

It should be noted that, similar to the parameter table 16a for temperature measurement and the parameter table 16b for dummy wafer illustrated in FIG. 3, a parameter table 16 for a product wafer is stored in the memory 12. Further, similar to the parameter table 16a for temperature measurement, a parameter table for pressure measurement or a parameter table for ion density detection may be stored in the memory 12.

The memory 12 is an example of the storage unit that may include a ROM (Read Only Memory), a RAM (Random Access Memory), a HDD (Hard Disk Drive), etc. It should be noted that the recipe 15 and the parameter table 16 may be stored in a hard disc or a semiconductor memory, or may be set at a predetermined position of the memory area in a state where they are stored in a portable computer readable recording medium including a CD-ROM, a DVD, etc.

The display 14 is an example of a display unit for displaying a result processed by the CPU 11. It should be noted that, when a product wafer is transported to any one of the process modules PM1-PM6, a plasma process including etching is performed on the product wafer. When a dummy wafer is transported to any one of the process modules PM1-PM6, a cleaning process is performed on the process module PM to which the dummy wafer has been transported. When a measurement wafer including a temperature measurement wafer, a pressure measurement wafer, etc., is transported to any one of the process modules PM1-PM6, measurement of wafer temperature or pressure is performed on the process module PM to which the wafer has been transported.

The communication I/F 13 is an interface for connecting to and communicating with a host computer 20 of a manufacturing execution system (MES). The communication I/F 13 may receive identification information of the FOUP or type information of the wafer stored in the FOUP from the host computer 20.

<Overall Structure of Process Module>

Figure 4:
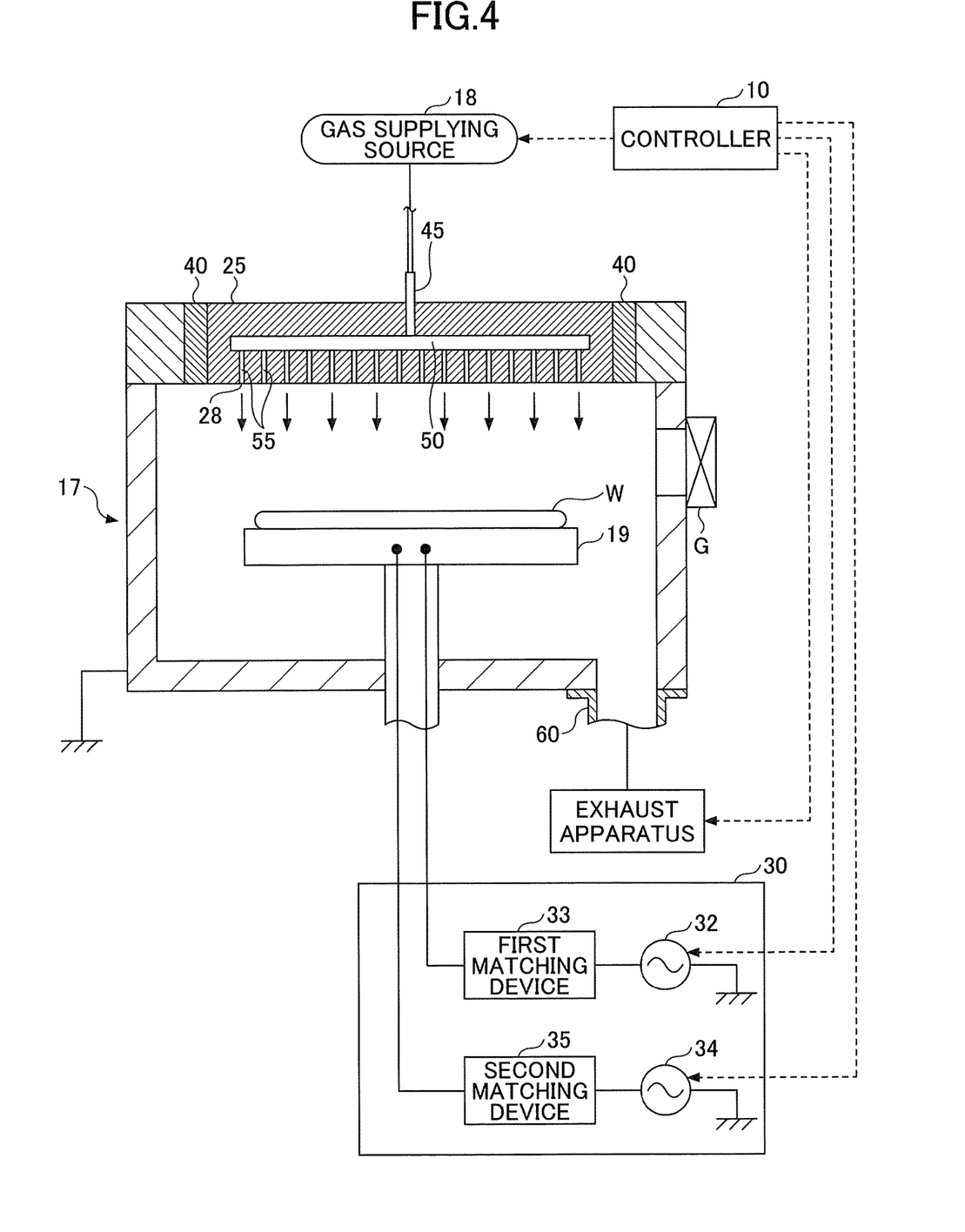
FIG. 4 is a drawing illustrating an example of a process module PM according to an embodiment of the invention.

A process module PM according to an embodiment of the present invention is capable of performing, but not specifically limited to, a plasma process including a process of Atomic Layer Etching (ALE), a process of Reactive Ion Etching (RIE), an ashing process, etc., on the wafer W.

The process module PM includes a processing container (chamber) 17 made of a conductive material such as aluminum and a gas supplying source 18 for supplying a gas in the processing container 17. The gas supplying source 18 supplies a predetermined process gas.

The processing container 17 is electrically grounded. Inside the processing container 17, a lower electrode 19 and an upper electrode 25 disposed facing and in parallel with the lower electrode 19 are included. The lower electrode 19 also functions as a stage on which the wafer W is placed. A power supplying apparatus 30 is connected to at least one of the lower electrode 19 and the upper electrode 25 (the lower electrode 19 in FIG. 4). The power supplying apparatus 30 includes a first high-frequency power supply 32 for supplying first high-frequency power with a first frequency (high-frequency power HF for generating plasma) and a second high-frequency power supply 34 for supplying second high-frequency power with a second frequency lower than the first frequency (high-frequency power LF for drawing ion). The first high-frequency power supply 32 is connected to the lower electrode 19 via a first matching device 33. The second high-frequency power supply 34 is connected to the lower electrode 19 via a second matching device 35. The first high-frequency power may be, for example, a frequency of 40 MHz. The second high-frequency power may be, for example, a frequency of 13.56 MHz.

The first matching device 33 and the second matching device 35 are used for matching a load impedance and an internal (or output) impedance of the first high-frequency power supply 32 and the second high-frequency power supply 34, respectively. When plasma is being generated in the processing container 17, the first matching device 33 and the second matching device 35 function in such a way that it appears that the internal impedance and the load impedance match with respect to the first high-frequency power supply 32 and the second high-frequency power supply 34, respectively.

The upper electrode 25 is attached to a ceiling portion of the processing container 17 via a sealed ring 40 that coats a peripheral portion of the upper electrode 25. In the upper electrode 25, a diffusion room 50 that diffuses a gas introduced from the gas supplying source 18 is included. A gas introduction port 45 is formed for the diffusion room 50, and various gases can be introduced from the gas supplying source 18 to the diffusion room 50 via the gas introduction port 45. Many gas flow paths 55 are formed in the upper electrode 25. The gas flow paths 55 are used for supplying a gas from the diffusion room 50 to the inside of the processing container 17.

First, a gas from the gas supplying source 18 is supplied to the diffusion room 50 via the gas introduction port 45 illustrated in FIG. 4. Next, the gas supplied to the diffusion room 50 is, after passing through the gas flow paths 55, supplied to the inside of the processing container 17 via gas holes 28. As described above, the upper electrode 25 with the above-described structure also functions as a gas shower head that supplies a gas.

An exhaust port 60 is formed in a bottom surface of the processing container 17. With this arrangement, it is possible to maintain the inside of the processing container 17 at a predetermined pressure. A gate valve G is disposed on a side wall of the processing container 17. The gate valve G opens and closes a load/unload port when loading and unloading the wafer W from the processing container 17.

According to the recipe 15, the control unit 10 controls process time of each step, switching time, pressure (exhausting of gas), high-frequency power or voltage, flow amount of various types of gases, wafer temperature, internal temperature of the processing container 17 (e.g., upper electrode temperature, side wall temperature of the processing container 17, ESC temperature), etc.

<Wafer Processing>

Figure 5:
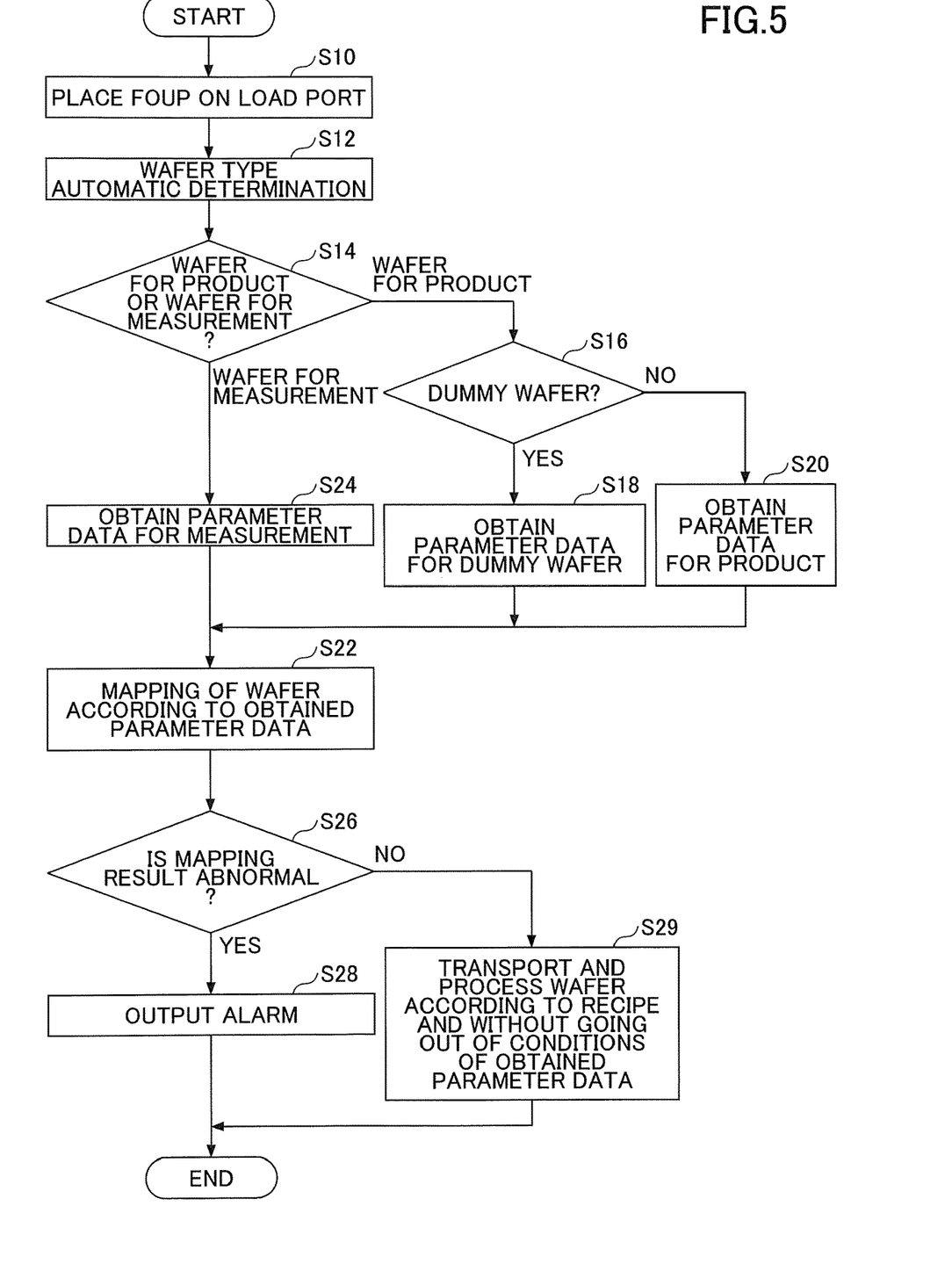
FIG. 5 is a flowchart illustrating an example of wafer processing according to an embodiment of the invention.

Next, referring to FIG. 5, an example of wafer processing according to an embodiment will be described. FIG. 5 is a flowchart illustrating an example of wafer processing according to an embodiment. When this processing is started, the CPU 11 causes a FOUP to be placed on the load port LP (step S10). Next, the CPU 11 detects identification information of the FOUP, and automatically determines a type of the wafer W stored in the FOUP based on the detection result (step S12).

An example will be described in which the CPU 11 detects identification information of the FOUP. For example, there are holes B1-B4 that penetrate the bottom portion of the FOUP illustrated in FIG. 6A. There are button units A1-A4 disposed on a placement surface of the load port LP on which the FOUP is placed. In this case, as shown in a bottom view and a side view of the FOUP illustrated in upper right and lower right of the right side of FIG. 6A, when the FOUP is placed on the load port LP, the button units A1-A4 go through the corresponding holes B1-B4 and thus protrude inside the FOUP.

Figure 6A:
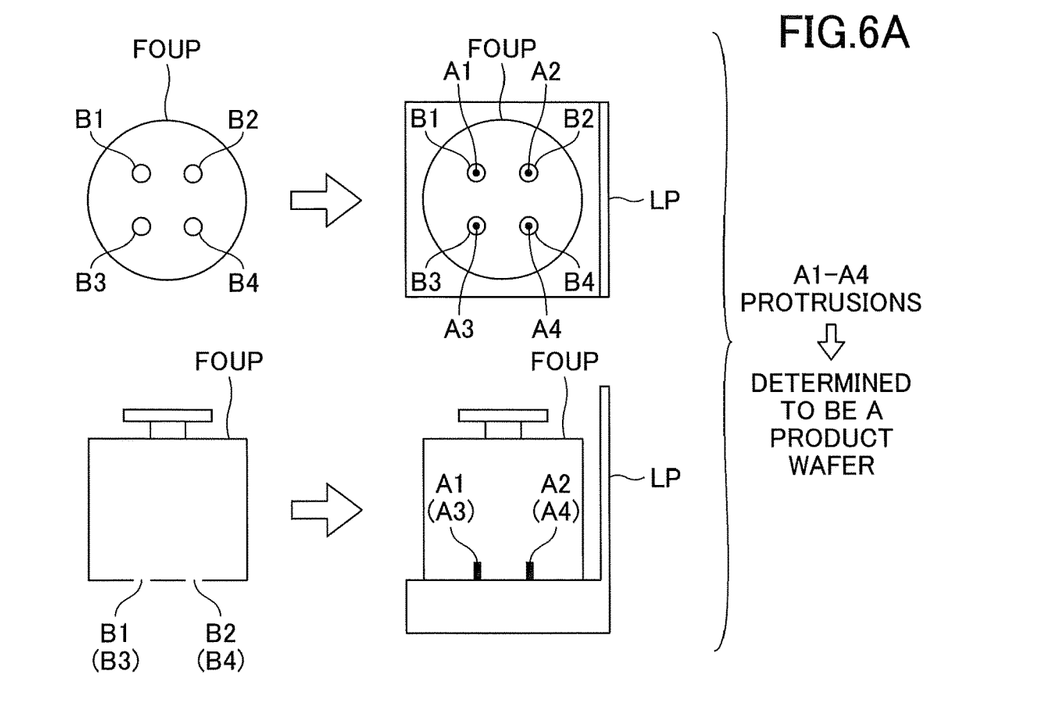
FIGS. 6A and 6B are drawings illustrating examples of identification information of a FOUP according to an embodiment of the invention.
Figure 6B:
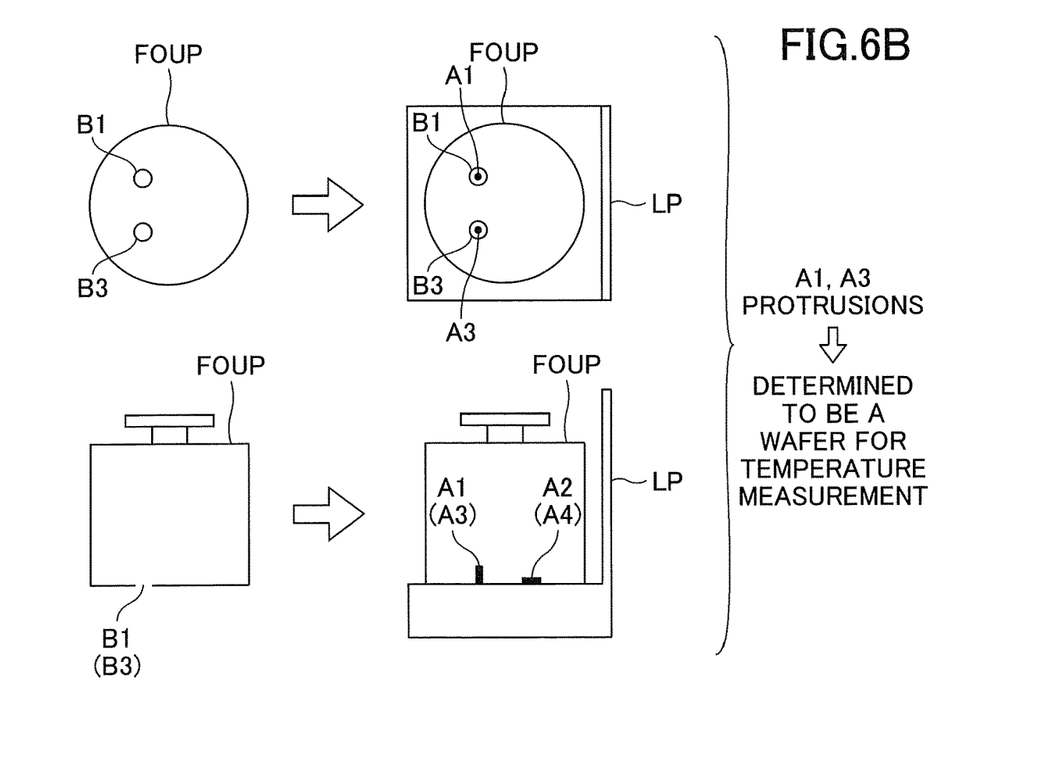

Further, for example, there are holes B1, B3 that penetrate the bottom portion of the FOUP illustrated in FIG. 6B. In this case, as shown in a bottom view and a side view of the FOUP illustrated in upper right and lower right of the right side of FIG. 6B, when the FOUP is placed on the load port LP, the button units A1, A3 go through the corresponding holes B1, B3 and thus protrude inside the FOUP. Each of the button units A2, A4 is pressed down by the bottom portion of the FOUP. It is assumed that a state in which a button unit A goes through a hole B is referred to as OFF (=0), and a state in which a button unit A is pressed down by the bottom portion of the FOUP is referred to as ON (=1).

Identification information of the FOUP corresponding to a combination of ON/OFF of button units A1-A4 is set in the memory 12 in advance. Therefore, the CPU 11 identifies the identification information of the FOUP from ON/OFF states of the button units A1-A4 by referring to the memory 12.

For example, as illustrated in FIG. 6A, in the case where all of the button units A1-A4 are in an OFF state, the CPU 11 obtains a detection result indicating that the identification information of the FOUP (A1, A2, A3, A4) is (0, 0, 0, 0). Based on the result, it is possible for the CPU 11 to determine that the type of the wafer W stored in the FOUP is, for example, "product wafer".

Further, as illustrated in FIG. 6B, in the case where the button units A1, A3 are in an OFF state and the button units A2, A4 are in an ON state, the CPU 11 obtains a detection result indicating that the identification information of the FOUP (A1, A2, A3, A4) is (0, 1, 0, 1). Based on the result, it is possible for the CPU 11 to determine that the type of the wafer W stored in the FOUP is, for example, "temperature measurement wafer". In this way, it is possible to determine the type of the wafer W based on the identification information (A1, A2, A3, A4) of the FOUP.

It should be noted that the method in which the CPU 11 automatically determines the type of the wafer based on the identification information of the FOUP is not limited to the above. It may be a method in which the CPU 11 reads a carrier ID of the FOUP and automatically determines the type of the wafer based on the carrier ID. Further, the CPU 11 may determine the type of the wafer according to the type information of the wafer W received from the host computer 20. Further, the CPU 11 may determine the type of the wafer according to the type information of the wafer W specified by an operator.

Next, returning to FIG. 5, the CPU 11 determines whether the type of the wafer W is that of the product wafer or that of the measurement wafer (step S14). Upon determining that the type of the wafer W is that of the product wafer, the CPU 11 determines whether or not the type of the wafer W is that of the dummy wafer (step S16).

Upon determining that the type of the wafer W is that of the dummy wafer, the CPU 11 obtains parameter data for the dummy wafer from the parameter table 16 stored in the memory 12 (step S18), and proceeds to step S22. On the other hand, in step S16, upon determining that the type of the wafer W is not that of the dummy wafer, the CPU 11 obtains parameter data for the product from the parameter table 16 stored in the memory 12 (step S20), and proceeds to step S22.

In step S14, upon determining that the type of the wafer W is that of a measurement wafer, the CPU 11 obtains parameter data for measurement from the parameter table 16 stored in the memory 12 (step S24), and proceeds to step S22.

In step S22, after automatically determining the type of the wafer, before carrying out the wafer W from the FOUP placed on the load port LP, the CPU 11 controls mapping of the FOUP according to the obtained parameter data. In the parameter table 16, transport conditions of the wafer W, processing conditions, and measurement conditions including the mapping can be set. As the mapping conditions, conditions related to double slot detection, slanting slot detection, etc., in the FOUP mapping can be set. The thickness and weight of the measurement wafer are greater than those of the product wafer. Therefore, it is necessary to change the conditions, including the width used for double slot detection as the mapping condition, from the conditions for the product wafer.

In the FOUP mapping, a sensor is attached to the tip of the pick of the first arm 211 or the second arm 221 on the atmosphere side illustrated in FIG. 1. The sensor is capable of taking an image of the inside of the FOUP. The arm, to which the sensor is attached, is directed to the FOUP and is moved up and down in the height direction of the FOUP, and thus, the FOUP is scanned by the sensor. With this arrangement, it is detected in which slot position in the FOUP the wafer is present. In this way, it is possible to detect that two sheets of wafer are inserted in the same slot in the FOUP (double slot detection), to detect that a wafer is inserted slantingly in the slot (slanting slot detection), and to detect other abnormalities.

Next, the CPU 11 determines whether there is an abnormality in the mapping result (step S26). In the case where the CPU 11 determines that there is an abnormality in the mapping result, the CPU 11 outputs an alarm (step S28) and the process is ended.

On the other hand, in the case where the CPU 11 determines that there is no abnormality in the mapping result, the wafer is carried out from the FOUP, a predetermined process is applied to the wafer by a predetermined process module PM, the wafer is stored in a predetermined FOUP of the load port LP (step S29), and the process is ended.

In step S29, the CPU 11 controls the process and transport of the wafer W by following the recipe and by maintaining within conditions of the obtained parameter data. For example, in the case where the type of the wafer W is a dummy wafer and where a condition set in the recipe goes out of the condition set in the parameter data for the dummy wafer, the process and the transport of the wafer are controlled so as to not go outside of the condition set in the parameter data. For example, in the case where a temperature T1 in step 1 of a recipe A illustrated in FIG. 2 exceeds an upper limit value (Max Tf) of a temperature set in the parameter table 16b for the dummy wafer in FIG. 3, the CPU 11 controls the process in such a way that the wafer temperature does not exceed the upper limit value Max Tf. Further, the CPU 11 controls the process in such a way that the transport speed of the dummy wafer does not exceed the upper limit value Max Vf.

Further, in the case where the automatically determined type of the wafer W is the measurement wafer, the CPU 11 controls the process and the transport of the wafer in such a way that the process conditions and transport conditions set in the recipe do not go out of the conditions set in the parameter data for measurement. For example, in the case where a temperature used in a recipe exceeds an upper limit value (Max Td) of a temperature set in the parameter table 16a in FIG. 3, the CPU 11 controls the process in such a way that the wafer temperature does not exceed the upper limit value Max Td. With this arrangement, it is possible to prevent damaging a temperature sensor mounted on a temperature measurement wafer.

Further, the CPU 11 controls the transport in such a way that the transport speed of the temperature measurement wafer does not exceed the upper limit value Max Vd. In general, a temperature measurement wafer is thicker and heavier than a product wafer. Therefore, when transporting a temperature measurement wafer, the CPU 11 controls the transport speed in such a way that the speed does not exceed the upper limit value Max Vd of the transport speed set in the parameter table 16a for the temperature measurement. In general, the upper limit value Max Vd of the transport speed, set in the parameter table 16a for temperature measurement, is set to a value less than the transport speed when transporting the product wafer. In this way, in an embodiment, in the case where the substrate is automatically determined to be a special substrate such as a measurement wafer, it is possible to transport the special substrate at a speed slower than that of a product substrate automatically. As a result, it is possible to prevent, for example, damaging the special substrate during the transport.

However, in the case where the transport speed of the product substrate is set to a value that does not exceed the upper limit value of the transport speed of the special substrate, the special substrate is transported at the transport speed of the product substrate. With this arrangement, compared with a case in which the transport speed is uniformly lowered regardless the type of the wafer, the transport delay is reduced, and thus, the transport time can be shortened.

Further, in an embodiment, an upper limit value of a high-frequency power RF applied inside the process module PM is set in the parameter table 16. The CPU 11 controls the high-frequency power RF in such a way that the upper limit value of the high-frequency power RF set in the parameter table 16 is not exceeded.

As the transport conditions of the wafer W set in the parameter table 16, other than the transport speed, an acceleration, a transport time, and an adjustment value for slightly adjusting a wafer position in z-direction may be set. The adjustment value for slightly adjusting a wafer position in z-direction is a value which takes into account a deflection according to the wafer weight, and which is used for adjusting the position in z-direction orthogonal to the transport direction.

As described above, in a substrate processing method according to an embodiment, different conditions for wafer abnormality detection and transport speed are set in the parameter table 16 between the product wafer and the measurement wafer. Therefore, by taking into account that the appropriate process conditions and transport conditions are different between the product wafer and the measurement wafer, it is possible to change the process conditions and transport conditions set in the recipe based on the parameter data corresponding to the automatically determined type of the wafer. With this arrangement, it is possible to apply appropriate process conditions and transport conditions according to the wafer type. Further, it is possible to avoid a burden of manually changing process conditions and transport conditions according to the wafer type.

(Modified Example)
<Wafer Processing>

Figure 7:
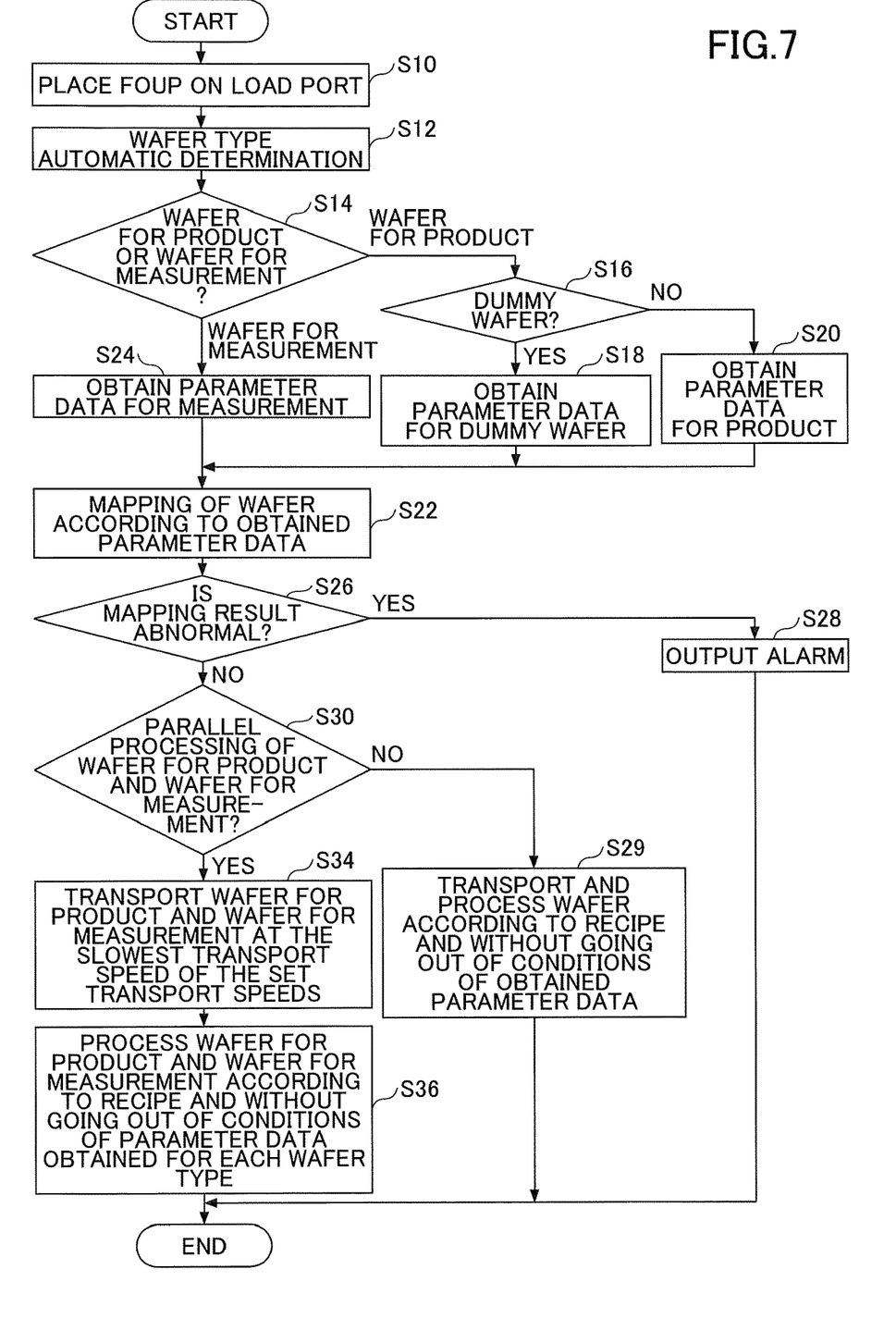
FIG. 7 is a flowchart illustrating an example of wafer processing according to a modified example.

Finally, referring to FIG. 7, an example of wafer processing according to a modified example will be described. FIG. 7 is a flowchart illustrating an example of wafer processing according to the modified example. It should be noted that the same step numbers are assigned to steps in which the same process is performed as in the flowchart illustrated in FIG. 5, and detailed descriptions are omitted.

When started, processes of steps S10-S26 are performed. In step S26, in the case where the CPU 11 determines that there is an abnormality in the mapping result, the CPU 11 outputs an alarm (step S28) and the process is ended.

On the other hand, in the case where the CPU 11 determines that there is no abnormality in the mapping result and where the types of the automatically determined wafers W are the product wafer and the measurement wafer, the CPU 11 determines whether the product wafer and the measurement wafer are to be processed in parallel (step S30). At this time, with respect to the product wafer, determination is performed including the dummy wafer.

For example, the above case corresponds to a case in which: a wafer W of a FOUP placed on the load port LP1 is transported to and processed by the process module PM1, and, in parallel, a wafer W of a FOUP placed on the load port LP2 is transported to and processed by the process module PM2; and one of the wafers W of the FOUPs placed on the load ports LP1 and LP2 is a product wafer and the other is a measurement wafer.

In the case where the CPU 11 determines that the product wafer and the measurement wafer are not processed in parallel, by following the recipe and by maintaining within the conditions set in the obtained parameter data, the CPU 11 transports the wafer from the FOUP, performs a predetermined process in the process module PM, stores the wafer in a predetermined FOUP of the load port LP (step S29), and the process is ended.

On the other hand, in step S30, in the case where the CPU 11 determines that the product wafer and the measurement wafer are to be processed in parallel, the CPU 11 transports the product wafer and the measurement wafer at the slowest transport speed of the transport speeds set in the parameter data sets corresponding to the types of the wafers stored in the FOUPs (step S34). Next, according to the recipes and without exceeding the conditions of the parameter data sets corresponding to the types of the wafers, the CPU 11 processes the product wafer and the measurement wafer in parallel (step S36), and the process is ended.

As described above, in a substrate processing method according to a modified example, by taking into account that the product wafer and the measurement wafer that have different thicknesses and weights are transported and processed in parallel, the transports and the processes of the wafers are controlled in such a way that each of the conditions of the parameter data sets corresponding to the types of the wafers is not exceeded.

For example, when the product wafer and the measurement wafer are transported in parallel, the transport speed is controlled to be the slowest transport speed of the transport speeds set in the parameter data sets corresponding to the types of the wafers. With this arrangement, based on the automatic determination result of the types of the wafers, it is possible to perform abnormality detection and transport even in the case where the wafers of different types are processed in parallel.

As described above, a substrate processing method and a substrate processing system have been described according to an embodiment. However, a substrate processing method and a substrate processing system according to an embodiment are not limited to the above. Various modifications and improvements may be possible within a scope of the present invention. Matters described in different embodiments may be combined within a range that does not conflict.

For example, in an embodiment and a modified example, in the case where the CPU 11 determines that there is an abnormality in the mapping result, the CPU 11 is configured to output an alarm (step S28 in FIG. 5 or FIG. 7). The CPU 11 is not limited to the above. In the case where the CPU 11 determines that there is an abnormality in the mapping result, the CPU 11 may perform the transport and the process of the wafer within a range of the upper limit value and/or the lower limit value set in the parameter table 16. Further, in the case where the CPU 11 determines that there is an abnormality in the mapping result, the CPU 11 may stop carrying out the wafer from the FOUP, and, after the state inside the FOUP is checked by an operator, the CPU 11 may restart the transport and the process of the wafer inside the FOUP according to an instruction of the operator.

A process module PM according to an embodiment can be applied to, not only a parallel plate double frequency applying apparatus as illustrated in FIG. 4, but also an inductively coupled plasma (ICP) processing apparatus, a plasma processing apparatus that uses a radial line slot antenna, a helicon wave plasma (HWP) processing apparatus, and an electron cyclotron resonance plasma (ECR) processing apparatus.

In the present specification, a semiconductor wafer W has been described as an etching target substrate. The etching target substrate is not limited to the above and may be various substrates used for a LCD (liquid crystal display), a FPD (flat panel display), or the like, a photomask, a CD substrate, a printed substrate, etc.

The present invention is not limited to the specifically disclosed embodiments, and variations and modifications may be made without departing from the scope of the present invention.

The present application is based on and claims the benefit of priority of Japanese Priority Application No. 2016-170312 filed on Aug. 31, 2016, the entire contents of which are hereby incorporated herein by reference.

What is claimed is:

1. A substrate processing method comprising:
placing a substrate storage container storing a substrate on a load port;
automatically determining a type of the substrate stored in the placed substrate storage container;
by referring to a storage unit that stores a parameter data set related to a transport condition for each substrate type, controlling transport of the substrate stored in the substrate storage container based on the parameter data set corresponding to the automatically determined type of the substrate to process the substrate, and
after automatically determining the type of the substrate, and before transporting the substrate stored in the substrate storage container, performing mapping based on conditions set in the parameter data set to detect an abnormality of the substrate stored in the substrate storage container.

2. The substrate processing method according to claim 1, wherein the storage unit further stores a parameter data set related to process conditions, the method further comprising: controlling, by referring to the storage unit, processing of the substrate stored in the substrate storage container based on the parameter data set corresponding to the automatically determined type of the substrate, and based on a predetermined recipe.

3. The substrate processing method according to claim 2, further comprising:
in the case where there is a value, in process conditions of the substrate set in the predetermined recipe, that is outside of the process conditions set in the parameter data set, controlling the processing of the substrate within the process conditions set in the parameter data set.

4. The substrate processing method according to claim 1, further comprising:
in the case where it is determined that, based on the automatically determined type of the substrate, the substrate stored in the substrate storage container is a special substrate different from a product substrate, controlling a transport speed of the special substrate to be slower than a transport speed of the product substrate based on the transport condition set in the parameter data set.

5. The substrate processing method according to claim 1, further comprising:
obtaining identification information of the substrate storage container when placing the substrate storage container on the load port; and automatically determining the type of the substrate stored in the substrate storage container based on the identification information.

6. The substrate processing method according to claim 1, further comprising:
placing a plurality of the substrate storage containers storing substrates on a load port;
automatically determining each of the types of the substrates stored in the placed substrate storage containers; and
in the case of processing and transporting in parallel the substrates stored in the substrate storage containers, transporting in parallel the substrates stored in the substrate storage containers at a speed equal to or less than a slowest transport speed of transport speeds set in the parameter data sets corresponding to the automatically determined types of the substrates.

7. A substrate processing system comprising:
a load port on which a substrate storage container storing a substrate is placed; and
a control unit configured to automatically determine a type of the substrate stored in the substrate storage container placed on the load port, and, by referring to a storage unit that stores a parameter data set related to a transport condition for each type of the substrates, to control transport of the substrate stored in the substrate storage container based on the parameter data set corresponding to the automatically determined substrate type, wherein
the control unit is further configured to, after automatically determining the type of the substrate, and before transporting the substrate stored in the substrate storage container, perform mapping based on conditions set in the parameter data set to detect an abnormality of the substrate stored in the substrate storage container.

8. The substrate processing system according to claim 7, wherein
the storage unit further stores a parameter data set related to process conditions, and wherein
the control unit controls processing of the substrate stored in the substrate storage container based on the parameter data set corresponding to the automatically determined substrate type, and based on a predetermined recipe.

* * * * *